United States Patent
Kim

(10) Patent No.: US 8,247,251 B2
(45) Date of Patent: Aug. 21, 2012

(54) METHOD OF FABRICATING LIGHT-EMITTING ELEMENT

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 308 days.

(21) Appl. No.: 12/653,435

(22) Filed: Dec. 14, 2009

(65) Prior Publication Data
US 2010/0151609 A1  Jun. 17, 2010

(30) Foreign Application Priority Data
Dec. 15, 2008 (KR) .................. 10-2008-0127333

(51) Int. Cl.
*H01L 21/00* (2006.01)
(52) U.S. Cl. .... 438/33; 438/458; 438/738; 257/E21.233
(58) Field of Classification Search .................. 438/33, 438/456, 458, 459; 257/E33.005, E33.055, 257/E33.025
See application file for complete search history.

(56) References Cited

U.S. PATENT DOCUMENTS

| | | | |
|---|---|---|---|
| 7,588,952 B2 * | 9/2009 | Lee et al. ................ | 438/28 |
| 7,842,966 B2 * | 11/2010 | Watanabe et al. .......... | 257/103 |
| 2007/0120140 A1 * | 5/2007 | Ogihara et al. ............ | 257/99 |
| 2008/0176477 A1 * | 7/2008 | Hwang et al. ............. | 445/24 |

FOREIGN PATENT DOCUMENTS

| | | |
|---|---|---|
| JP | 2008-78275 A | 4/2008 |
| KR | 10-0331447 B1 | 3/2002 |
| KR | 10-0705225 B1 | 4/2007 |

OTHER PUBLICATIONS

Machine translation JP 2008-078275.*
Machine translation KR 1020050123857.*
Machine translation KR 1019990038313.*

* cited by examiner

*Primary Examiner* — Julio J Maldonado
*Assistant Examiner* — Sonya McCall Shepard
(74) *Attorney, Agent, or Firm* — Onello & Mello, LLP

(57) ABSTRACT

A method of fabricating a light-emitting element, in which less stress is applied to the light-emitting element, includes: forming element isolation patterns on a substrate; forming a buffer layer on an entire surface of the substrate to directly contact the surface of the substrate and the element isolation patterns and forming light-emitting structure layers on the buffer layer; forming element isolation trenches, which overlap at least part of the element isolation patterns, respectively, buffer layer patterns and light-emitting structures which are separated from each other by the element isolation trenches, respectively, by etching the buffer layer and the light-emitting structure layers; injecting a lift-off solution into the element isolation trenches to remove the element isolation patterns; and removing the substrate.

9 Claims, 7 Drawing Sheets

METHOD OF FABRICATING LIGHT-EMITTING ELEMENT

This application claims priority from Korean Patent Application No. 10-2008-0127333 filed on Dec. 15, 2008 in the Korean Intellectual Property Office, the entire contents of which are incorporated herein by reference.

BACKGROUND

1. Field of the Invention

The present invention relates to a method of fabricating a light-emitting element, in which less stress is applied to the light-emitting element.

2. Description of the Related Art

Light-emitting elements, such as light-emitting diodes (LEDs), emit light when electrons combine with holes. Light-emitting elements consume low power, have a long life, can be installed in a limited space, and are resistant to vibrations.

Light-emitting elements are classified into vertical type light-emitting elements, lateral type light-emitting elements, flipchip type light-emitting elements, and the like.

Of the above light-emitting elements, the vertical type light-emitting elements are being widely used since they can be reduced in size and have superior current diffusion properties. For example, a vertical light-emitting element may include a light-emitting structure in which a gallium nitride (GaN) pattern of an n type, a light-emitting pattern, and a GaN pattern of a p type are stacked. Light is generated in the light-emitting pattern when carriers (e.g., electrons) of the n-type GaN pattern combine with carriers (e.g., holes) of the p-type GaN pattern.

It is difficult as well as expensive to implement a substrate made of GaN series. Therefore, a heterogeneous substrate may be formed of GaN and a material different from GaN, such as silicon (Si), sapphire, or silicon carbide (SiC). Then, a light-emitting structure may be formed on the heterogeneous substrate, and the heterogeneous substrate may be removed from the light-emitting structure to complete a light-emitting element. This method of fabricating a light-emitting element is now being researched.

A substrate may be removed from a light-emitting structure by a lift-off method such as a chemical lift-off (CLO) method or a laser lift-off (LLO) method.

However, when the CLO method is used, a sacrificial layer interposed between the substrate and the light-emitting structure may cause stress on the light-emitting structure. Since the LLO method uses a high-power laser beam, stress may be applied to (for example, cracks may be created in) the light-emitting structure when the LLO method is used.

SUMMARY

Aspects of the present inventive concept provide a method of fabricating a light-emitting element, in which less stress is applied to the light-emitting element.

However, aspects of the present inventive concept are not restricted to those set forth herein. The above and other aspects of the present inventive concept will become more apparent to one of ordinary skill in the art to which the present invention pertains by referencing the detailed description of the present invention given below.

According to an aspect of the present inventive concept, there is provided a method of fabricating a light-emitting element. The method includes: forming element isolation patterns on a substrate; forming a buffer layer on an entire surface of the substrate to directly contact the surface of the substrate and the element isolation patterns and forming light-emitting structure layers on the buffer layer; forming element isolation trenches, which overlap at least part of the element isolation patterns, respectively, buffer layer patterns and light-emitting structures which are separated from each other by the element isolation trenches, respectively, by etching the buffer layer and the light-emitting structure layers; injecting a lift-off solution into the element isolation trenches to remove the element isolation patterns; and removing the substrate.

In one embodiment, the element isolation patterns are made of silicon oxide ($SiO_2$), and the lift-off solution is hydrogen fluoride (HF).

In one embodiment, the method further comprises bonding a support substrate onto the light-emitting structures to face the substrate after removing the element isolation patterns and before removing the substrate, wherein the removing the substrate comprises removing the substrate from the light-emitting structures by radiating a laser beam to the substrate.

In one embodiment, the buffer layer is formed by an epitaxial lateral overgrowth (ELOG) method.

In one embodiment, a width of each of the element isolation trenches is less than a width of each of the element isolation patterns so that the element isolation trenches completely overlap the element isolation patterns, respectively. In one embodiment, a ratio of a width of a lower part of each of the buffer layer patterns, which directly contacts the substrate after the element isolation patterns are removed, to a width of an upper part of each of the buffer layer patterns, which directly contacts one of the light-emitting structures, is 0.8 to 0.85. In one embodiment, a ratio of the width of each of the element isolation trenches to the width of each of the element isolation patterns is greater than 0.2 and less than 1.

In one embodiment, the removing of the substrate comprises etching the buffer layer patterns by injecting a buffer layer pattern etchant into the element isolation trenches after removing the element isolation patterns.

In one embodiment, the removing of the substrate comprises performing a chemical mechanical planarization (CMP) process on the substrate after removing the element isolation patterns.

In one embodiment, two or more element isolation patterns are separated from each other by a first separation width, and each of the element isolation trenches has a second width, which is greater than the first separation width, and overlaps at least part of each of the element isolation patterns.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
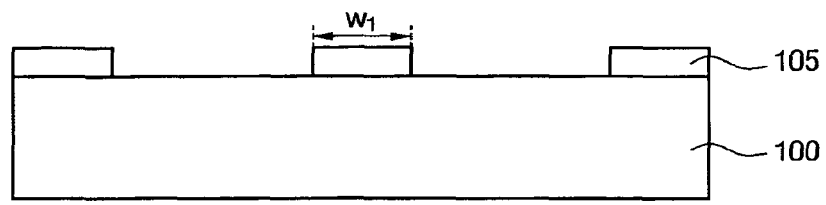
FIGS. 1 through 5 are cross-sectional views illustrating processes included in a method of fabricating a light-emitting element according to a first exemplary embodiment of the present inventive concept.

Advantages and features of the present invention and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this description will be thorough and complete and will fully convey the inventive concept to those skilled in the art, and the present inventive concept will only be defined by the appended claims.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section described below could be termed a second element, component or section without departing from the teachings of the present inventive concept.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower," "above," "upper," and the like, may be used herein for ease of description to describe the relationship of one element or component to another element(s) or component(s) as illustrated in the figures. It will be understood that the spatially relative terms are intended to encompass different orientations of the device in use or operation, in addition to the orientation depicted in the figures.

Embodiments of the inventive concept are described herein with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, a method of fabricating a light-emitting element according to a first exemplary embodiment of the present inventive will be described in detail with reference to FIGS. 1 through 5. FIGS. 1 through 5 are cross-sectional views illustrating processes included in the method of fabricating a light-emitting element according to the first exemplary embodiment of the present inventive concept.

Referring to FIG. 1, element isolation patterns 105 are formed on a substrate 100.

The substrate 100 may be a sapphire substrate, a silicon (Si) substrate, a silicon carbide (SiC) substrate, a sapphire substrate on which gallium nitride (GaN) is formed, an Si substrate on which GaN is formed, or an SiC substrate on which GaN is formed.

A device isolation layer (not shown) is formed on the substrate 100 and then patterned to form the element isolation patterns 105.

The element isolation patterns 105 may be of a stripe type or a mesh type and may have any shape.

A width w1 of each of the element isolation patterns 105 is greater than a gap between a plurality of light-emitting elements formed in the substrate 100. As will be described later, when a buffer layer 110 is formed by an epitaxial lateral overgrowth (ELOG) method, the width w1 of each of the element isolation patterns 105 may be less than a critical width to which the buffer layer 110 can overgrow laterally from a surface of the substrate 100. Thus, the width w1 of each of the element isolation patterns 105 may be, for example, greater than 0.1 μm and less than 50 μm.

The element isolation patterns 105 may be made of a material that can be removed by a chemical lift-off (CLO) method.

The element isolation patterns 105 according to the present embodiment may be made of, for example, silicon oxide ($SiO_2$). The element isolation patterns 105 according to the present embodiment, which are made of silicon oxide (SiO2), are removed by a lift-off solution in a subsequent process. The lift-off solution according to the present embodiment may be, for example, hydrogen fluoride (HF) that can remove silicon oxide ($SiO_2$).

While the element isolation patterns 105 according to the present embodiment are made of silicon oxide ($SiO_2$), they may be made of a metal material, such as chrome nitride (CrN), in a modified example of the present embodiment.

When the element isolation patterns 105 are made of chrome nitride (CrN), they may be removed by the CLO method which uses a lift-off solution that can etch chrome nitride (CrN).

Figure 2:
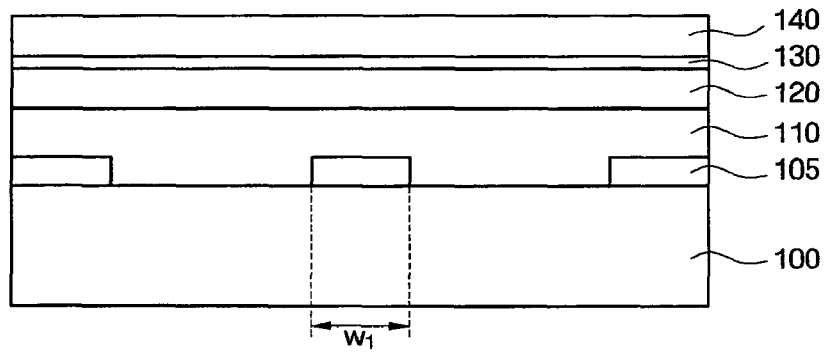

Referring to FIG. 2, the buffer layer 110 is formed on the surface of the substrate 100 and the element isolation patterns 105. The buffer layer 110 directly contacts the surface of the substrate 100 and the element isolation patterns 105.

The buffer layer 110 may be made of a material which facilitates the growth of light-emitting structure layers thereon. The buffer layer 110 may be made one of $In_xAl_yGa_{(1-x-y)}N$ series ($0 \leq x \leq 1$, $0 \leq y \leq 1$), $Si_xC_yN_{(1-x-y)}$ series ($0 \leq x \leq 1$, $0 \leq y \leq 1$), and zinc oxide (ZnO) series which are not doped with impurities. For example, the buffer layer 110 may be made of a material selected from gallium nitride (GaN), aluminum gallium nitride (AlGaN), aluminum nitride (AlN), indium gallium nitride (InGaN), silicon carbide (SiC), and zinc oxide (ZnO). The light-emitting structure layers can grow more easily on the buffer layer 110, which is made of one of the above materials, than on a metal layer such as chrome nitride (CrN). In addition, the electrical properties of the light-emitting structure layers may not degrade.

The buffer layer 110 may be used as a sacrificial layer which is removed in a subsequent process by a laser beam used in the LLO method to remove the substrate 100. The buffer layer 110 minimizes damage to the light-emitting element due to the LLO method and helps the formation of light-emitting structures.

The buffer layer 110 may be formed by using the ELOG method. The buffer layer 110 begins to grow from the surface of the substrate 100 and then overgrows laterally from the surface of the substrate 100 to completely cover upper surfaces of the element isolation patterns 105. Accordingly, the buffer layer 110 directly contacts the surface of the substrate 100 and the element isolation patterns 105. A region of the buffer layer 110, which contacts the substrate 100, is reduced by the width w1 of each of the element isolation patterns 105.

The method of forming the buffer layer 110 is not limited to the ELOG method which uses a metal organic chemical vapor deposition (MOCVD) method. The buffer layer 110 may also be grown by liquid phase epitaxy, hydride vapor phase epitaxy, molecular beam epitaxy, metal organic vapor phase epitaxy (MOVPE), or the like.

Next, a first impurity layer 120, a light-emitting layer 130, and a second impurity layer 140 are sequentially formed on the buffer layer 110.

Specifically, the light-emitting structure layers (i.e., the first impurity layer 120, the light-emitting layer 130, and the second impurity layer 140), which are sequentially formed, are etched to form first impurity layer patterns 121, light-emitting layer patterns 131, and second impurity layer patterns 141.

The light-emitting structure layers may be formed by MOCVD, liquid phase epitaxy, hydride vapor phase epitaxy, molecular beam epitaxy, MOVPE, or the like.

Specifically, the first impurity layer patterns 121 may be of a first conductivity type (e.g., an n type), and the second impurity layer patterns 141 may be of a second conductivity type (e.g., a p type). Conversely, the first impurity layer patterns 121 may be of the second conductivity type (the p type), and the second impurity layer patterns 141 may be of the first conductivity type (the n type), depending on how the light-emitting element is designed.

The light-emitting layer patterns 131 are regions where light is generated when carriers (e.g., electrons) of the first impurity layer patterns 121 combine with carriers (e.g., holes) of the second impurity layer patterns 141. Each of the light-emitting layer patterns 131 may include a well layer and a barrier layer. Since the well layer has a smaller band gap than the barrier layer, the carriers (electrons and holes) gather in the well layer and combine together. The light-emitting layer patterns 131 may have a single quantum well (SQW) structure or a multiple quantum well (MQW) structure, depending on the number of well layers included in each of the light-emitting layer patterns 131. The SQW structure includes only one well layer while the MQW structure includes a plurality of well layers. In order to control light-emitting properties, at least one of the well layer and the barrier layer may be doped with at least one of boron (B), phosphorous (P), silicon (Si), magnesium (Mg), zinc (Zn), selenium (Se), and aluminum (Al).

After the second impurity layer patterns 141 are formed, the second impurity layer patterns 141 may be annealed to activate the second impurity layer patterns 141.

Figure 3:
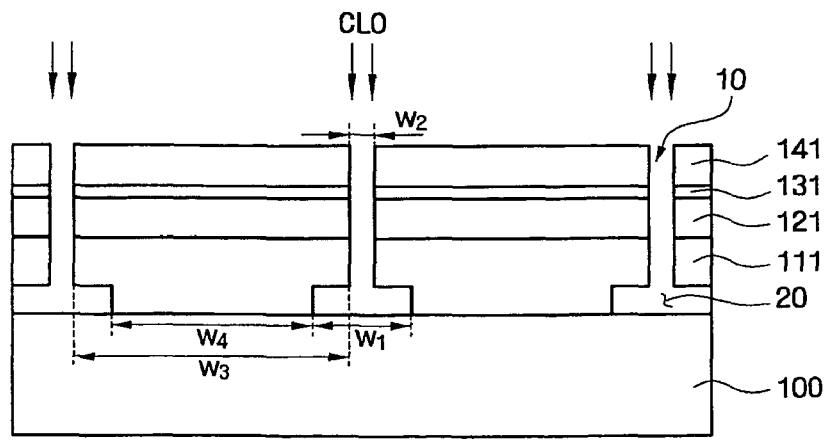

Referring to FIGS. 2 and 3, the buffer layer 110 and the light-emitting structure layers (i.e., the first impurity layer 120, the light-emitting layer 130, and the second impurity layer 140) are etched to form element isolation trenches 10, light-emitting structures (each including one of the first impurity layer patterns 121, one of the light-emitting layer patterns 131, and one of the second impurity layer patterns 141), and buffer layer patterns 111.

The buffer layer 110 and the light-emitting structure layers may be dry-etched.

The element isolation trenches 10 are formed longitudinally on the element isolation patterns 105 and thus overlap the element isolation patterns 105, respectively. Since the element isolation trenches 10 are designed to form the light-emitting structures and the buffer layer patterns 111 on the substrate 100, the element isolation trenches 10 may be narrow as long as they can separate the light-emitting structures as well as the buffer layer patterns 111 from each other. When the resolution limit of an exposure unit and the space into which a lift-off solution is injected are taken into consideration, a width w2 of each of the element isolation trenches 10 may be approximately 10 μm. The width w2 of each of the element isolation trenches 10 may be less than the width w1 of each of the element isolation patterns 105. That is, the width w1 of each of the element isolation patterns 105 is greater than the width w2 of each of the element isolation trenches 10. A ratio of the width w2 of each of the element isolation trenches 10 to the width w1 of each of the element isolation patterns 105 may be greater than 0.2 and less than 1.

The element isolation trenches 10 separate the light-emitting structures from each other. A width w3 of each of the light-emitting structures may be, for example, 200 to 250 μm. An upper part of each of the buffer layer patterns 111, which directly contacts a lower part of each of the light-emitting structures, may have the same width (w3) as each of the light-emitting structures.

A region of a lower part of each of the buffer layer patterns 111 directly contacts the substrate 100 and the other regions of the lower part thereof directly contact the element isolation patterns 105. Accordingly, a width w4 of the region of the lower part of each of the buffer layer patterns 111, which directly contacts the surface of the substrate 100, is less than the width w3 of the upper part of each of the buffer layer patterns 111. A ratio of the width w4 of the region of the lower part of each of the buffer layer patterns 111, which directly contacts the surface of the substrate 100, to the width w3 of the upper part of each of the buffer layer patterns 111 may be 0.8 to 0.85.

Next, a lift-off solution is injected into the element isolation trenches 10. The lift-off solution injected into the element isolation trenches 10 removes the entire element isolation patterns 105 to form isolation spaces 20. Each of the isolation spaces 20 reduces a contact area between each of the buffer layer patterns 111 and the substrate 100, thereby making it easier to remove the substrate 100 in a subsequent process. When the element isolation patterns 105 are made of silicon oxide ($SiO_2$), hydrogen fluoride (HF) can be used as the lift-off solution as described above.

Figure 4:
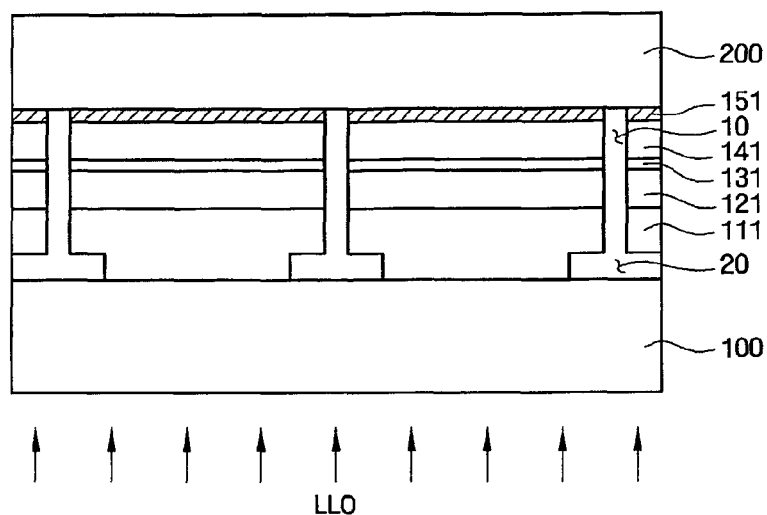

Referring to FIG. 4, second electrode patterns 151 are formed on the second impurity layer patterns 141, respectively. The second electrode patterns 151 may be made of transparent or opaque metal. Here, the opaque metal may be reflective metal such as aluminum (Al) or silver (Ag).

Although not shown in the drawing, a second ohmic layer (not shown) may be formed on the second impurity layer patterns 141 to improve contact resistance. The second ohmic layer may be made of at least one of indium tin oxide (ITO), zinc oxide (ZnO), silver (Ag), titanium (Ti), aluminum (Al), aurum (Au), nickel (Ni), indium oxide (In$_2$O$_3$), tin oxide (SnO$_2$), copper (Cu), tungsten (W), and platinum (Pt).

Next, a support substrate 200 bonded or electroplated onto the second electrode patterns 151 to face the substrate 100. The support substrate 200 may be made of one of silicon (Si), strained Si, silicon alloy, Si—Al, silicon-on-insulator (SOI), silicon carbide (SiC), silicon germanium (SiGe), silicon germanium carbide (SiGeC), germanium (Ge), germanium (Ge) alloy, gallium arsenide (GaAs), indium arsenide (InAs), III-V semiconductor, II-VI semiconductor, copper-tungsten (CuW) metal, and nickel (Ni) metal. When the support substrate 200 is made of one of the above materials, its thermal conductivity is higher than that of the substrate 100. Thus, the support substrate 200 can improve heat radiation properties of the light-emitting element.

Although not shown in the drawing, a barrier layer (not shown) and an adhesive material layer (not shown) may be interposed between the support substrate 200 and the second electrode patterns 151. The adhesive material layer is a material used to bond the support substrate 200 onto the second electrode patterns 151. The adhesive material layer may be a conductive material, e.g., a metal layer. The metal layer may include at least one of aurum (Au), silver (Ag), platinum (Pt), nickel (Ni), copper (Cu), tin (Sn), aluminum (Al), plumbum (Pb), chrome (Cr), and titanium (Ti). That is, the metal layer may be a monolayer which is made of one of aurum (Au), silver (Ag), platinum (Pt), nickel (Ni), copper (Cu), tin (Sn), aluminum (Al), plumbum (Pb), chrome (Cr) and titanium (Ti), a stack of the same, or a combination of the same. For example, the metal layer may be an aurum (Au) layer (a monolayer), an aurum-tin (Au—Sn) layer (a double layer), or a multi-layer having aurum (Au) and tin (Sn) alternately stacked several times. The adhesive material layer may be made of a material having lower reflexibility than those of the second electrode patterns 151 (or the second ohmic layer). The barrier layer prevents the second electrode patterns 151 (or the second ohmic layer, which function as a light-reflecting metal, from being damaged by the adhesive material layer. The barrier layer may be a monolayer which is made of one of platinum (Pt), nickel (Ni), copper (Cu), aluminum (Al), chrome (Cr), titanium (Ti) and tungsten (W), a stack of the same, or a combination of the same. For example, the barrier layer may be a multi-layer having titanium-tungsten (TiW) and platinum (Pt) alternately stacked several times.

Next, a laser beam is radiated to the substrate 100 to remove the substrate 100 from the light-emitting structures. Since the element isolation patterns 105 were removed in the previous process, the width w4 of the region of the lower part of each of the buffer layer patterns 111, which contacts the surface of the substrate 100, is less than the width w3 of the upper part of each of the buffer layer patterns 111. Thus, it is easy to remove the substrate 100. That is, in the present embodiment, the element isolation patterns 105 are removed in advance by the CLO method, and the substrate 100 is removed from the light-emitting structures by the LLO method. Consequently, stress applied to the light-emitting element by a high-power laser beam can be reduced. In this case, the buffer layer patterns 111 can be used as the above-described sacrificial layer which is removed by a laser beam. The substrate 100 is removed from the light-emitting structures when the buffer layer patterns 111 are removed by a laser beam.

Figure 5:
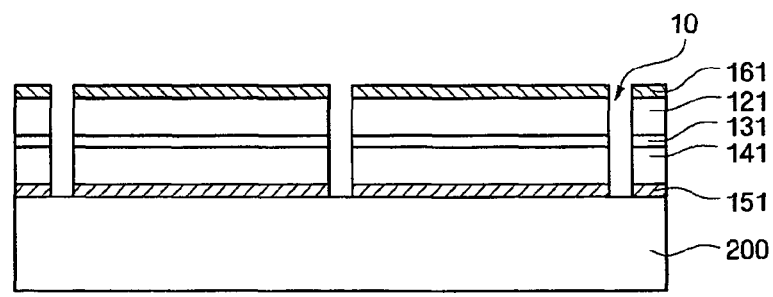

Referring to FIG. 5, first electrode patterns 161 are formed on the first impurity layer patterns 121. Although not shown in the drawing, a first ohmic layer (not shown) may be interposed between the first impurity layer patterns 121 and the first electrode patterns 161. The first ohmic layer may be made of at least one of indium tin oxide (ITO), zinc (Zn), zinc oxide (ZnO), silver (Ag), titanium (Ti), aluminum (Al), aurum (Au), nickel (Ni), indium oxide (In$_2$O$_3$), tin oxide (SnO$_2$), copper (Cu), tungsten (W), and platinum (Pt).

Figure 6:
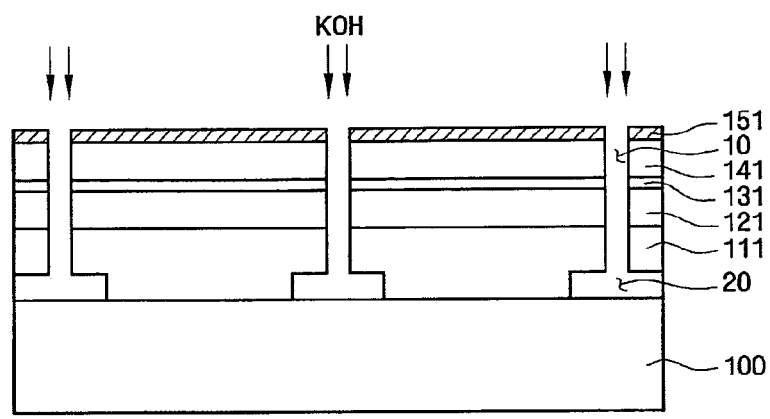
FIG. 6 is a cross-sectional view illustrating a method of fabricating a light-emitting element according to a second exemplary embodiment of the present inventive concept.

Hereinafter, a method of fabricating a light-emitting element according to a second exemplary embodiment of the present invention will be described in detail with reference to FIGS. 1 through 6. FIG. 6 is a cross-sectional view illustrating the method of fabricating a light-emitting element according to the second exemplary embodiment of the present invention. In the following embodiments, description of elements substantially identical to those of the previous embodiment will not be repeated.

Element isolation patterns 105 are removed by using the method described above with reference to FIGS. 1 through 3. Accordingly, element isolation trenches 10 and isolation spaces 20 are formed in not only upper surfaces but also sidewalls of light-emitting structures (i.e., first impurity layer patterns 121, light-emitting layer patterns 131, and second impurity layer patterns 141) and buffer layer patterns 111.

Referring to FIG. 6, second electrode patterns 151 are formed on the second impurity layer patterns 141.

Then, a support substrate (not shown) is bonded or electroplated onto the second electrode patterns 151 to face substrate 100.

A buffer layer pattern etchant is injected into the element isolation trenches 10, and ultraviolet (UV) light is radiated to the buffer layer patterns 111 through the substrate 100 in order to etch the buffer layer patterns 111. Specifically, the buffer layer pattern etchant is injected into the element isolation trenches 10 and the isolation spaces 20 formed along the sidewalls of the light-emitting structures and the buffer layer patterns 111. In this case, potassium hydroxide (KOH) may be used as the buffer layer pattern etchant for removing the buffer layer patterns 111. As the buffer layer patterns 111 are removed, the substrate 100 is also removed.

Referring to FIG. 5, first electrode patterns 161 are formed on the first impurity layer patterns 121 to form the light-emitting element.

Figure 7:
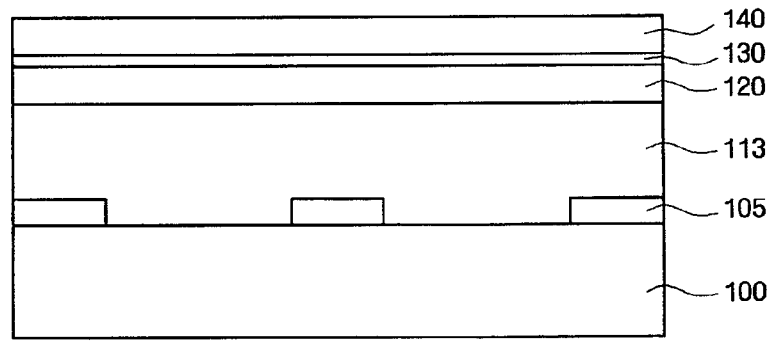
FIGS. 7 through 9 are cross-sectional views illustrating processes included in a method of fabricating a light-emitting element according to a third exemplary embodiment of the present inventive concept.
Figure 8:
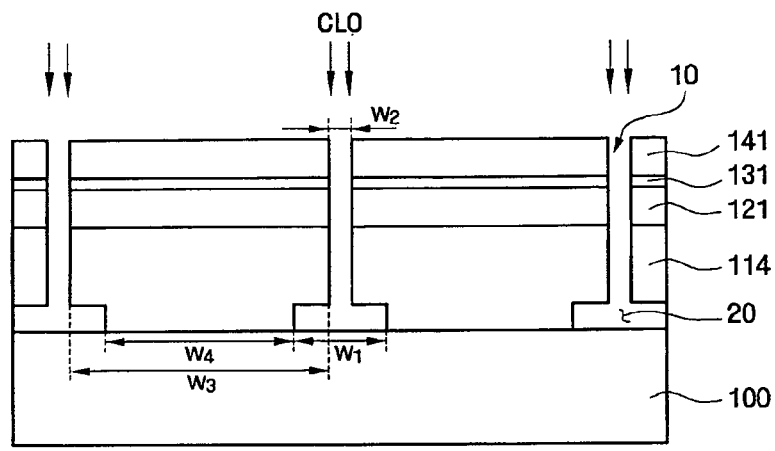
Figure 9:
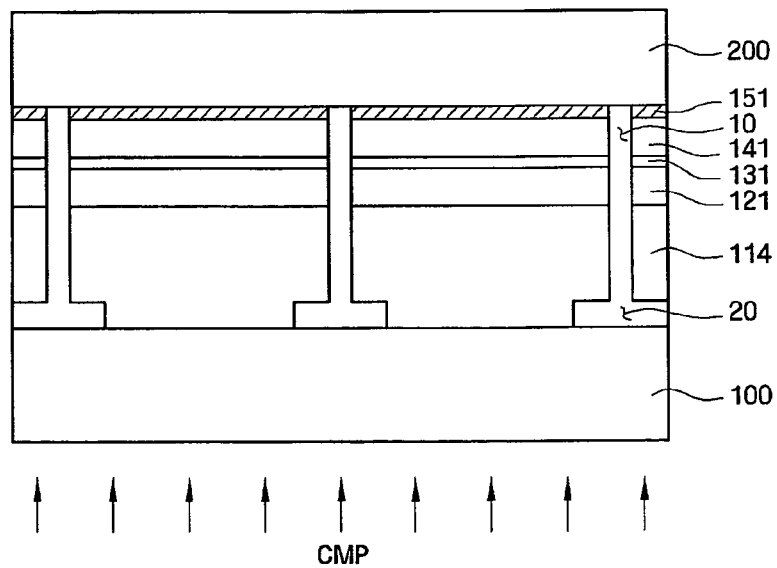

Hereinafter, a method of fabricating a light-emitting element according to a third exemplary embodiment of the present invention will be described in detail with reference to FIGS. 1, 5, and 7 through 9. FIGS. 7 through 9 are cross-sectional views illustrating processes included in the method of fabricating a light-emitting element according to the third exemplary embodiment of the present invention.

First, element isolation patterns 105 are formed on a substrate 100 by using the process described above with reference to FIG. 1.

Referring to FIG. 7, a buffer layer 113 is formed on the substrate 100 and the element isolation patterns 105. The buffer layer 113 is formed by using the process described above in the first exemplary embodiment but formed to a greater thickness d1 than the buffer layer 110 according to the first exemplary embodiment. This is to prevent the light-emitting element from being damaged when a chemical mechanical planarization (CMP) process is performed on the substrate 100 in a subsequent process.

Referring to FIG. 8, the buffer layer 113 and light-emitting structure layers (i.e., a first impurity layer 120, a light-emitting layer 130, and a second impurity layer 140) are etched to form element isolation trenches 10, light-emitting structures (each including one of first impurity layer patterns 121, one of light-emitting layer patterns 131, and one of second impurity layer patterns 141), and buffer layer patterns 114. The element isolation trenches 10, the light-emitting structures, and the buffer layer patterns 114 are formed in the same way as those according to the first exemplary embodiment.

Next, a lift-off solution is injected into the element isolation trenches 10 to remove the entire element isolation patterns 105. As a result, isolation spaces 20 are formed.

Referring to FIG. 9, second electrode patterns 151 are formed on the second impurity layer patterns 141, and a support substrate 200 is bonded onto the second electrode patterns 151 to face the substrate 100.

Then, the substrate 100 is removed by the CMP process. In this case, since each of the buffer layer patterns 114 is formed to a predetermined thickness, the light-emitting element is not damaged during the CMP process. In addition, a portion of each of the buffer layer patterns 114 may also be removed when the substrate 100 is removed. The remaining portion of each of the buffer layer patterns 114 may be wet-etched or dry-etched.

Next, first electrode patterns 161 are formed on the first impurity layer patterns 121 by using the method described above with reference to FIG. 5.

Hereinafter, a method of fabricating a light-emitting element according to a fourth exemplary embodiment of the present invention will be described in detail with reference to FIGS. 10 through 14. FIGS. 10 through 14 are cross-sectional views sequentially showing processes included in the method of fabricating a light-emitting element according to the fourth exemplary embodiment of the present invention.

Figure 10:
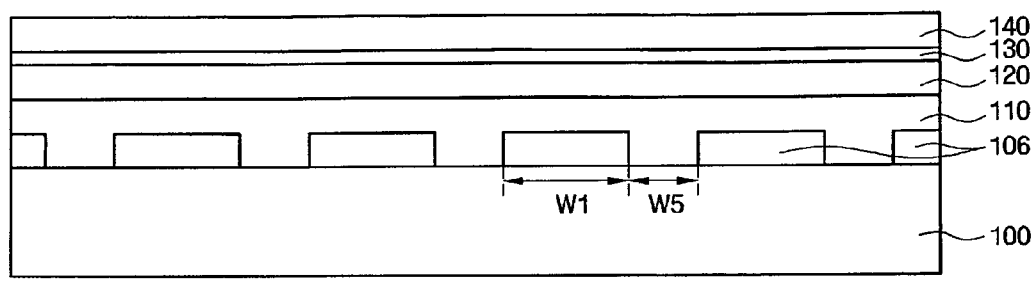
FIGS. 10 through 14 are cross-sectional views illustrating processes included in a method of fabricating a light-emitting element according to a fourth exemplary embodiment of the present inventive concept.

Referring to FIG. 10, a plurality of element isolation patterns 106 are formed at intervals of a first separation width w5. A width w1 of each of the element isolation patterns 106 according to the present embodiment may be equal to or different from that of each of the element isolation patterns 105 according to the first exemplary embodiment. The first separation width w5 may be smaller than the width w1 of each of the element isolation patterns 106.

Next, a buffer layer 110 is formed on the element isolation patterns 106 to directly contact a surface of a substrate 100 and the element isolation patterns 105. The buffer layer 110 directly contacts the substrate 100 in each space formed by the first separation width w5. The first width w5 may be formed as narrow as possible as long as it allows the buffer layer 110 to contact the substrate 100, so that the substrate 100 can be easily removed in a subsequent LLO process. Next, a first impurity layer 120, a light-emitting layer 130, and a second impurity layer 140 are sequentially formed on the buffer layer 110. The buffer layer 110, the first impurity layer 120, the light-emitting layer 130, and the second impurity layer 140 may be formed of the same materials and in the same way as those according to the first exemplary embodiment.

Figure 11:
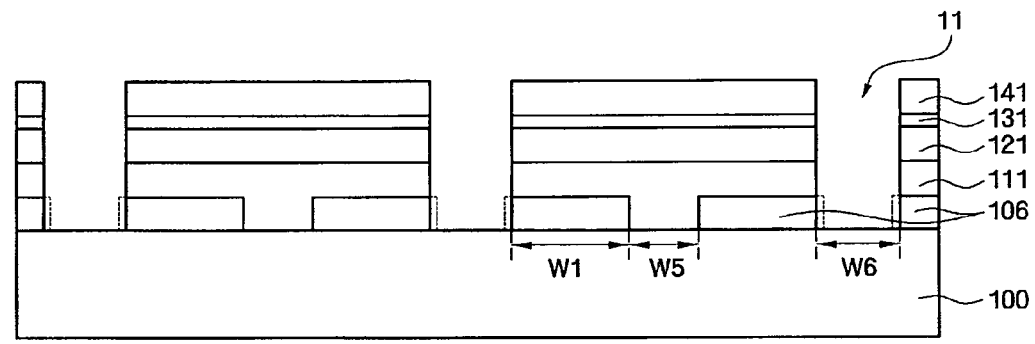

Referring to FIGS. 10 and 11, the buffer layer 110 and light-emitting structure layers (i.e., the first impurity layer 120, the light-emitting layer 130, and the second impurity layer 140) are etched to form element isolation trenches 11, light-emitting structures (each including one of first impurity layer patterns 121, one of light-emitting layer patterns 131, and one of second impurity layer patterns 141), and buffer layer patterns 111.

Each of the element isolation trenches 11 according to the present embodiment may have a second width w6 which is greater than the first separation width w5. Accordingly, each of the element isolation trenches 11 overlaps at least part of each of the element isolation patterns 106 which are separated from each other by the first separation width w5. That is, every two of the element isolation patterns 106 are respectively disposed on both sides of each of the element isolation trenches 11, and each of every two of the element isolation patterns 106 overlaps part of one of the element isolation trenches 11. A region indicated by dotted lines is where each of the element isolation patterns 106 existed. That is, a region of each of the element isolation patterns 106 overlaps one of the element isolation trenches 11 and thus is removed.

Figure 12:
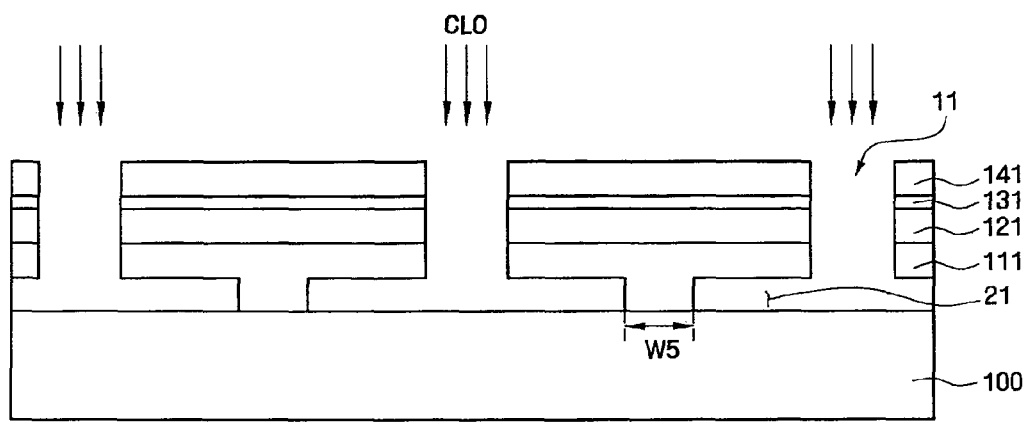

Referring to FIG. 12, a lift-off solution is injected into the element isolation trenches 11 to remove the element isolation patterns 106. When the element isolation patterns 106 are made of $SiO_2$, hydrogen fluoride (HF) is injected into the element isolation trenches 11 to remove the element isolation patterns 106. As a result, isolation spaces 21 are formed on both sides of a lower part of each of the buffer layer patterns 111, wherein a width of the lower part of each of the buffer layer patterns 111 is equal to the first separation width w5, and a width of each of the isolation spaces 21 is equal to the width w1 of each of the element isolation patterns 106. That is, only a region of each of the buffer layer patterns 111, which corresponds to the first separation width w5, contacts the substrate 10.

Figure 13:
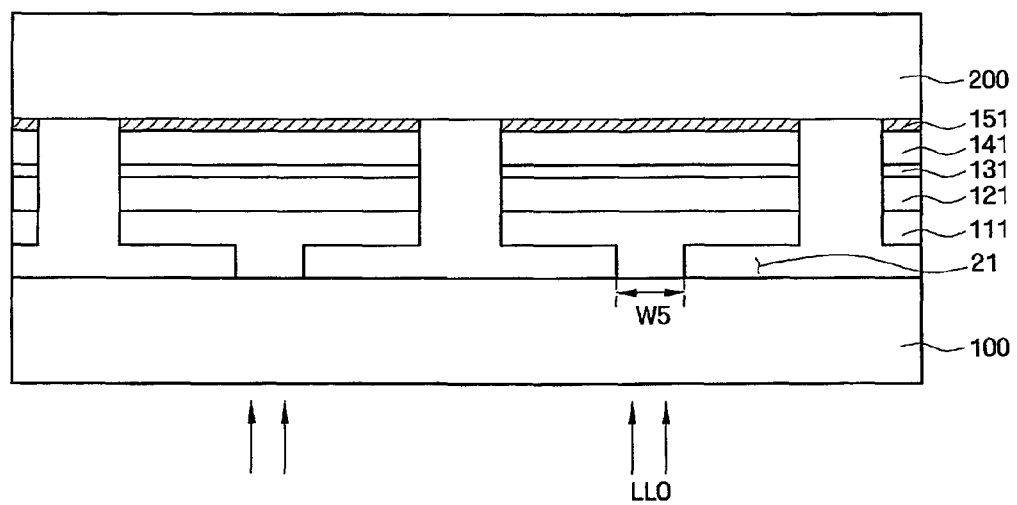

Referring to FIG. 13, second electrode patterns 151 are formed on the second impurity layer patterns 141, and a support substrate 200 is bonded or electroplated onto the second electrode patterns 151.

Next, a laser beam is radiated to the substrate 100 to remove the buffer layer patterns 111. As a result, the substrate 100 is removed from the light-emitting element. As described above, the width of the region of each of the buffer layer patterns 111, which contacts the substrate 100, is equal to the first separation width w5. That is, since the lower part of each of the buffer layer patterns 111 is significantly narrower than an upper part thereof, stress applied to the light-emitting element in the LLO process can be sharply reduced.

Figure 14:
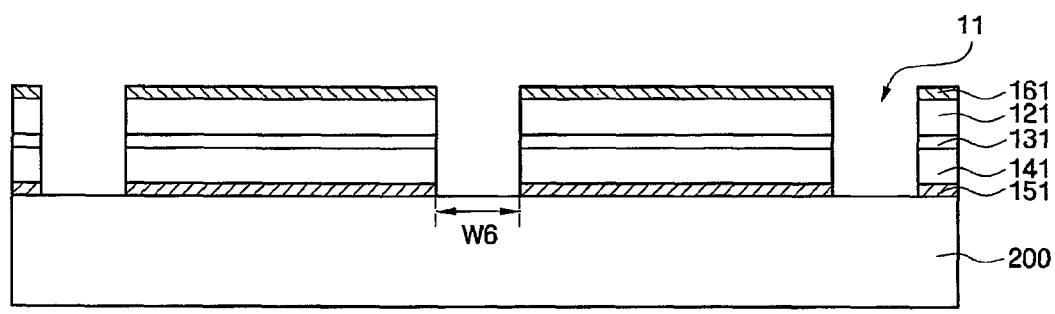

Referring to FIG. 14, first electrode patterns 161 are formed on the first impurity layer patterns 121.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of fabricating a light-emitting element, the method comprising:
    forming element isolation patterns on a substrate;
    forming a buffer layer on an entire surface of the substrate to directly contact the surface of the substrate and the element isolation patterns and forming light-emitting structure layers on the buffer layer;
    forming element isolation trenches, which overlap at least part of the element isolation patterns, respectively, buffer layer patterns and light-emitting structures which are separated from each other by the element isolation trenches, respectively, by etching the buffer layer and the light-emitting structure layers;
    injecting a lift-off solution into the element isolation trenches to remove the element isolation patterns; and
    removing the substrate,
    wherein the removing of the substrate comprises etching the buffer layer patterns by injecting a buffer layer pattern etchant into the element isolation trenches after removing the element isolation patterns.

2. The method of claim 1, wherein the element isolation patterns are made of silicon oxide ($SiO_2$), and the lift-off solution is hydrogen fluoride (HF).

3. The method of claim 1, further comprising bonding a support substrate onto the light-emitting structures to face the substrate after removing the element isolation patterns and before removing the substrate, wherein the removing the substrate comprises removing the substrate from the light-emitting structures by radiating a laser beam to the substrate.

4. The method of claim 1, wherein the buffer layer is formed by an epitaxial lateral overgrowth (ELOG) method.

5. The method of claim 1, wherein a width of each of the element isolation trenches is less than a width of each of the element isolation patterns so that the element isolation trenches completely overlap the element isolation patterns, respectively.

6. The method of claim 5, wherein a ratio of a width of a lower part of each of the buffer layer patterns, which directly contacts the substrate after the element isolation patterns are removed, to a width of an upper part of each of the buffer layer patterns, which directly contacts one of the light-emitting structures, is 0.8 to 0.85.

7. The method of claim 6, wherein a ratio of the width of each of the element isolation trenches to the width of each of the element isolation patterns is greater than 0.2 and less than 1.

8. The method of claim 1, wherein the removing of the substrate comprises performing a chemical mechanical planarization (CMP) process on the substrate after removing the element isolation patterns.

9. The method of claim 1, wherein two or more element isolation patterns are separated from each other by a first separation width, and each of the element isolation trenches has a second width, which is greater than the first separation width, and overlaps at least part of each of the element isolation patterns.

* * * * *